(12) United States Patent
Cheng et al.

(10) Patent No.: US 10,665,199 B2
(45) Date of Patent: *May 26, 2020

(54) LIQUID CRYSTAL DISPLAY POWER SAVING METHOD

(71) Applicant: Raydium Semiconductor Corporation, Hsinchu (TW)

(72) Inventors: Shao-Chun Cheng, Hsinchu (TW); Chung-Sung Tsai, New Taipei (TW); Chi-Te Lee, Taipei (TW); Yi-Ping Lee, Taipei (TW)

(73) Assignee: Raydium Semiconductor Corporation, Hsinchu County (TW)

( * ) Notice: Subject to any disclaimer, the term of this patent is extended or adjusted under 35 U.S.C. 154(b) by 0 days.

This patent is subject to a terminal disclaimer.

(21) Appl. No.: 16/124,725

(22) Filed: Sep. 7, 2018

(65) Prior Publication Data

US 2019/0073980 A1    Mar. 7, 2019

Related U.S. Application Data

(60) Provisional application No. 62/555,573, filed on Sep. 7, 2017.

(51) Int. Cl.
*G09G 3/36* (2006.01)
*G01R 19/165* (2006.01)

(52) U.S. Cl.
CPC ..... *G09G 3/3688* (2013.01); *G01R 19/16576* (2013.01); *G09G 3/3614* (2013.01); *G09G 3/3666* (2013.01); *G09G 2310/0248* (2013.01); *G09G 2310/0291* (2013.01); *G09G 2330/023* (2013.01)

(58) Field of Classification Search
CPC ..... G01R 19/16576; G09G 2310/0248; G09G 2310/0291; G09G 2330/023; G09G 3/3614; G09G 3/3666; G09G 3/3688; G09G 3/3648; G09G 3/2096; H04L 25/49
See application file for complete search history.

(56) References Cited

U.S. PATENT DOCUMENTS

| 7,148,868 B2* | 12/2006 | Lee | G09G 3/3648 345/87 |
|---|---|---|---|
| 2010/0188374 A1* | 7/2010 | Chen | G09G 3/3614 345/204 |

(Continued)

*Primary Examiner* — Richard J Hong

(57) ABSTRACT

A liquid crystal display power saving method is disclosed. It includes steps of: (a) dividing output channels coupled to a panel into multiple sets and each set includes M output channels, M is a positive integer; (b) calculating an average of the (N−1)-th display line of the panel after charge sharing, N is a positive integer larger than 1; (c) determining whether each of M output channels consumes power when it transmits a data signal from the (N−1)-th display line to the N-th display line; (d) calculating total power consumption of transmitting the data signal from the (N−1)-th display line to the N-th display line under possible charge sharing methods among the M output channels; (e) selecting a lowest power consumption charge sharing method from the possible charge sharing methods; and (f) switching coupling relationships among the M output channels according to the lowest power consumption charge sharing method.

10 Claims, 7 Drawing Sheets

(56) References Cited

U.S. PATENT DOCUMENTS

| | | | | |
|---|---|---|---|---|
| 2010/0289791 A1* | 11/2010 | Weng | .................. | G09G 3/3688 345/213 |
| 2012/0013591 A1* | 1/2012 | Kim | ..................... | G09G 3/3648 345/211 |
| 2012/0154358 A1* | 6/2012 | Chen | .................. | G09G 3/3614 345/209 |
| 2012/0249618 A1* | 10/2012 | Sugiyama | ............... | H04L 25/49 345/691 |
| 2012/0320019 A1* | 12/2012 | Jeong | .................. | G09G 3/2096 345/211 |
| 2014/0160107 A1* | 6/2014 | Lo | ........................ | G09G 3/3688 345/212 |
| 2016/0171942 A1* | 6/2016 | Chang | ................... | G09G 3/3648 345/87 |

\* cited by examiner

LIQUID CRYSTAL DISPLAY POWER SAVING METHOD

CROSS-REFERENCE TO RELATED APPLICATIONS

This Application claims the benefit of U.S. Provisional Application 62/555,573 filed on Sep. 7, 2017.

BACKGROUND

Field

The invention relates to a display; in particular, to a liquid crystal display power saving method.

Description of the Related Art

In general, as to the panel structure design of the most current liquid crystal displays, the Zigzag structure and the Pixel 3-5 (HSD2) structure are usually used. In addition, the output polarity inversion methods used in the output channels of the source driver can be 1V inversion, 2V inversion and (2V+1) inversion.

However, since there is no effective power saving method used for the current panel structure cooperated with the output of the source driver, it is hard to reduce the power consumption of the liquid crystal display.

SUMMARY

Therefore, the invention provides a liquid crystal display power saving method to solve the above-mentioned problems of the prior arts.

A preferred embodiment of the invention is a liquid crystal display power saving method. In this embodiment, the liquid crystal display power saving method includes steps of: (a) dividing output channels coupled to a panel into multiple sets of output channels and each set of output channels includes M output channels, M is a positive integer; (b) calculating an average of the (N−1)-th display line of the panel after charge-sharing, N is a positive integer larger than 1; (c) determining whether each of the M output channels consumes power when it transmits data signal from the (N−1)-th display line to the N-th display line; (d) calculating a total power consumption of transmitting the data signal from the (N−1)-th display line to the N-th display line under a plurality of possible charge-sharing methods among the M output channels; (e) selecting a lowest power consumption charge sharing method from the plurality of possible charge sharing methods; and (f) switching coupling relationships among the M output channels according to the lowest power consumption charge sharing method.

In an embodiment, the step (c) determines whether each output channel consumes power according to a voltage level variation when the data signal outputted by the output channel is transmitted from the (N−1)-th display line to the N-th display line.

In an embodiment, if the voltage level variation of the data signal is away from a reference voltage level, then the step (c) determines that the output channel consumes power.

In an embodiment, the reference voltage level is a ground voltage.

In an embodiment, if the voltage level variation of the data signal is approaching a reference voltage level, then the step (c) determines that the output channel does not consume power.

In an embodiment, between the step (a) and the step (b), the liquid crystal display power saving method further includes a step of: setting a register to store the average after charge-sharing calculated by the step (b).

In an embodiment, between the step (a) and the step (b), the liquid crystal display power saving method further includes a step of: selecting a normally black mode or a normally white mode.

In an embodiment, in the normally black mode, the data signals outputted by the M output channels maintain their original phase.

In an embodiment, in the normally white mode, the data signals outputted by the M output channels change their original phase to a reversed phase.

Compared to the prior art, the liquid crystal display power saving method of the invention provides a charge-sharing algorism for any output channel of a source driver suitable for all pixel structures of the panel and it can select the lowest power consumption charge-sharing method between two adjacent data lines and then switch the coupling relationships among the output channels of the source driver accordingly to effectively reduce the power consumption of the liquid crystal display.

The advantage and spirit of the invention may be understood by the following detailed descriptions together with the appended drawings.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of its scope, may admit to other equally effective embodiments.

FIG. 2 illustrates a schematic diagram of each set of output channels including six output channels CH1~CH6.

Figure 6:
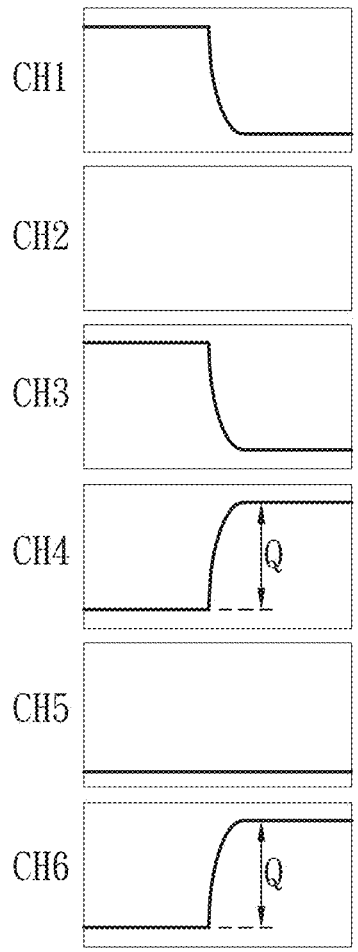
Figure 6:
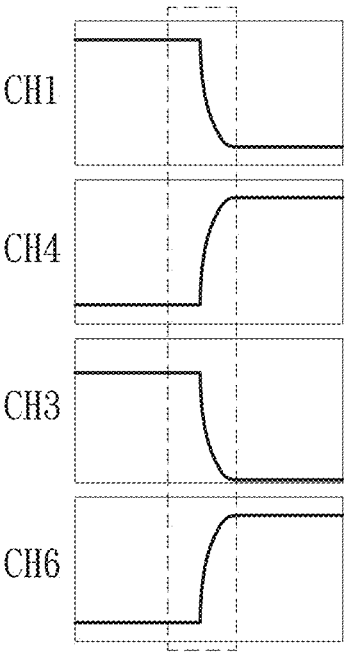

Left side of FIG. 6 illustrates a schematic diagram of the power consumption generated when the data signal is transmitted from the second data line L2 of the panel to the third data line L3 without charge-sharing; right side of FIG. 6 illustrates a schematic diagram of using the lowest power consumption charge-sharing method to perform charge sharing to reduce power consumption when the data signal is transmitted from the second data line L2 of the panel to the third data line L3.

Figure 7:
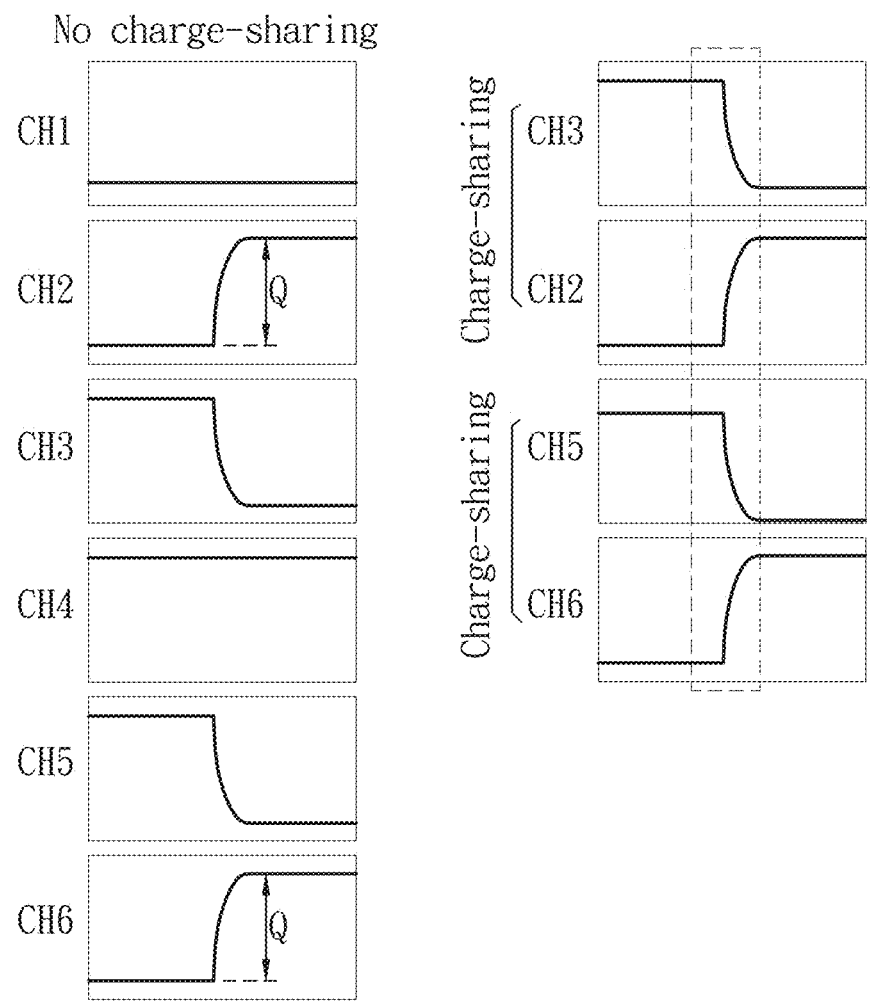

Left side of FIG. 7 illustrates a schematic diagram of the power consumption generated when the data signal is transmitted from the fourth data line L4 of the panel to the fifth data line L5 without charge-sharing; right side of FIG. 7 illustrates a schematic diagram of using the lowest power consumption charge-sharing method to perform charge sharing to reduce power consumption when the data signal is transmitted from the fourth data line L4 of the panel to the fifth data line L5.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

A preferred embodiment of the invention is a liquid crystal display power saving method. In this embodiment, the liquid crystal display power saving method can be suitable for all pixel structures of the panel and provide a charge-sharing algorism for any output channel of a source driver to select the lowest power consumption charge-sharing method between two adjacent data lines and then switch the coupling relationships among the output channels of the source driver accordingly to effectively reduce the power consumption of the liquid crystal display.

Figure 1:
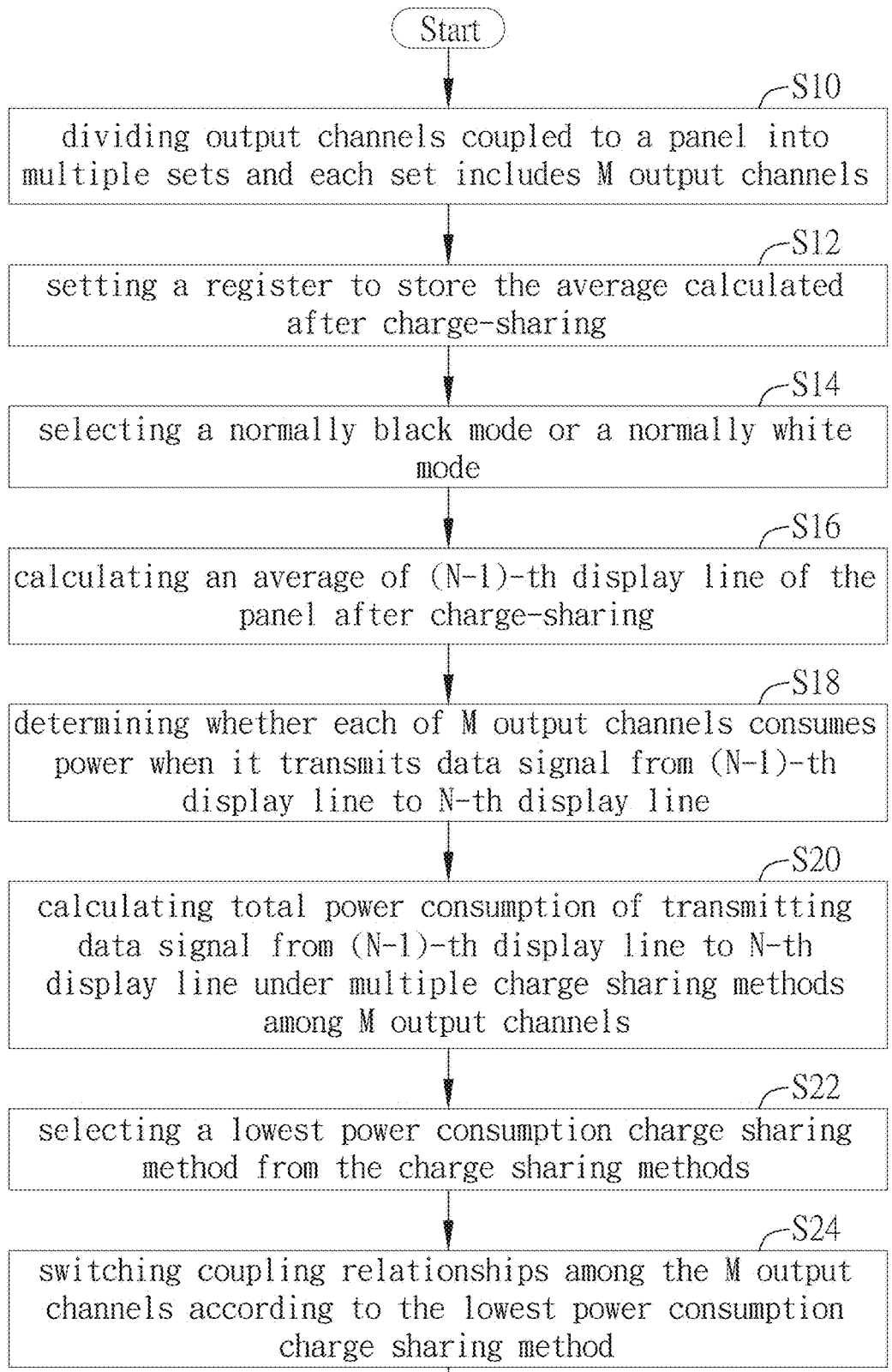
FIG. 1 illustrates a flowchart of the liquid crystal display power saving method in an embodiment of the invention.

Please refer to FIG. 1. FIG. 1 illustrates a flowchart of the liquid crystal display power saving method in this embodiment.

As shown in FIG. 1, the liquid crystal display power saving method can include the following steps of:

S10: dividing output channels coupled to a panel into multiple sets of output channels and each set of output channels includes M output channels, M is a positive integer;

S12: setting a register to store the average calculated after charge-sharing;

S14: selecting a normally black mode or a normally white mode;

S16: calculating an average of the (N−1)-th display line of the panel after charge-sharing, N is a positive integer larger than 1;

S18: determining whether each of the M output channels consumes power when it transmits data signal from the (N−1)-th display line to the N-th display line;

S20: calculating total power consumption of transmitting data signal from the (N−1)-th display line to the N-th display line under multiple charge sharing methods among the M output channels;

S22: selecting a lowest power consumption charge sharing method from the charge sharing methods; and S24: switching coupling relationships among the M output channels according to the lowest power consumption charge sharing method.

In an embodiment, the step S18 can determine whether each output channel consumes power according to a voltage level variation when the data signal outputted by the output channel is transmitted from the (N−1)-th display line to the N-th display line.

For example, when the data signal outputted by an output channel is transmitted from the (N−1)-th display line to the N-th display line, if the voltage level variation of the data signal is away from a reference voltage level, then the step S18 determines that the output channel consumes power when the output channel transmits the data signal from the (N−1)-th display line to the N-th display line; if the voltage level variation of the data signal is approaching the reference voltage level, then the step S18 determines that the output channel does not consume power when the output channel transmits the data signal from the (N−1)-th display line to the N-th display line.

For example, for the source driver of all positive voltage, no matter the output polarity of the output channel is positive (+) or negative (−), if the voltage level of the data signal outputted by the output channel is rising, the output channel consumes power; if the voltage level of the data signal outputted by the output channel is falling, the output channel does not consume power.

For the source driver of positive and negative voltages, when the output polarity of the output channel is positive (+), if the voltage level of the data signal outputted by the output channel is rising, the output channel consumes power and if the voltage level of the data signal outputted by the output channel is falling, the output channel does not consume power; on the contrary, when the output polarity of the output channel is negative (−), if the voltage level of the data signal outputted by the output channel is rising, the output channel does not consume power and if the voltage level of the data signal outputted by the output channel is falling, the output channel consumes power.

In addition, if the step S14 selects the normally black mode, the data signals outputted by the M output channels maintain their original phase in the normally black mode; if the step S14 selects the normally white mode, the data signals outputted by the M output channels change their original phase to a reversed phase in the normally white mode.

Figure 2:
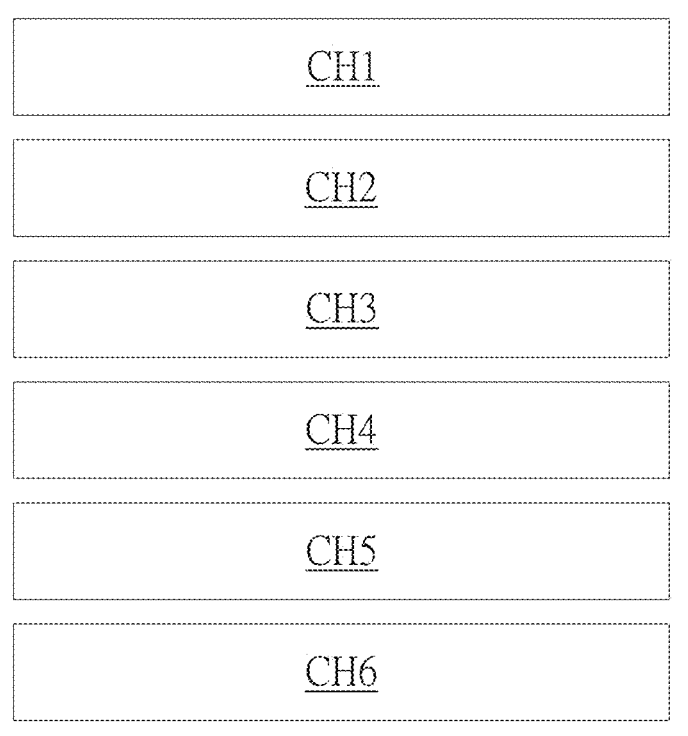

In the step S10, all output channels are divided into multiple sets of output channels and each set of output channels includes M output channels, wherein M is a positive integer. In an embodiment, as shown in FIG. 2, if M=6, namely each set of output channels includes 6 output channels including a first output channel CH1~a sixth output channel CH6, but not limited to this.

Figure 3:
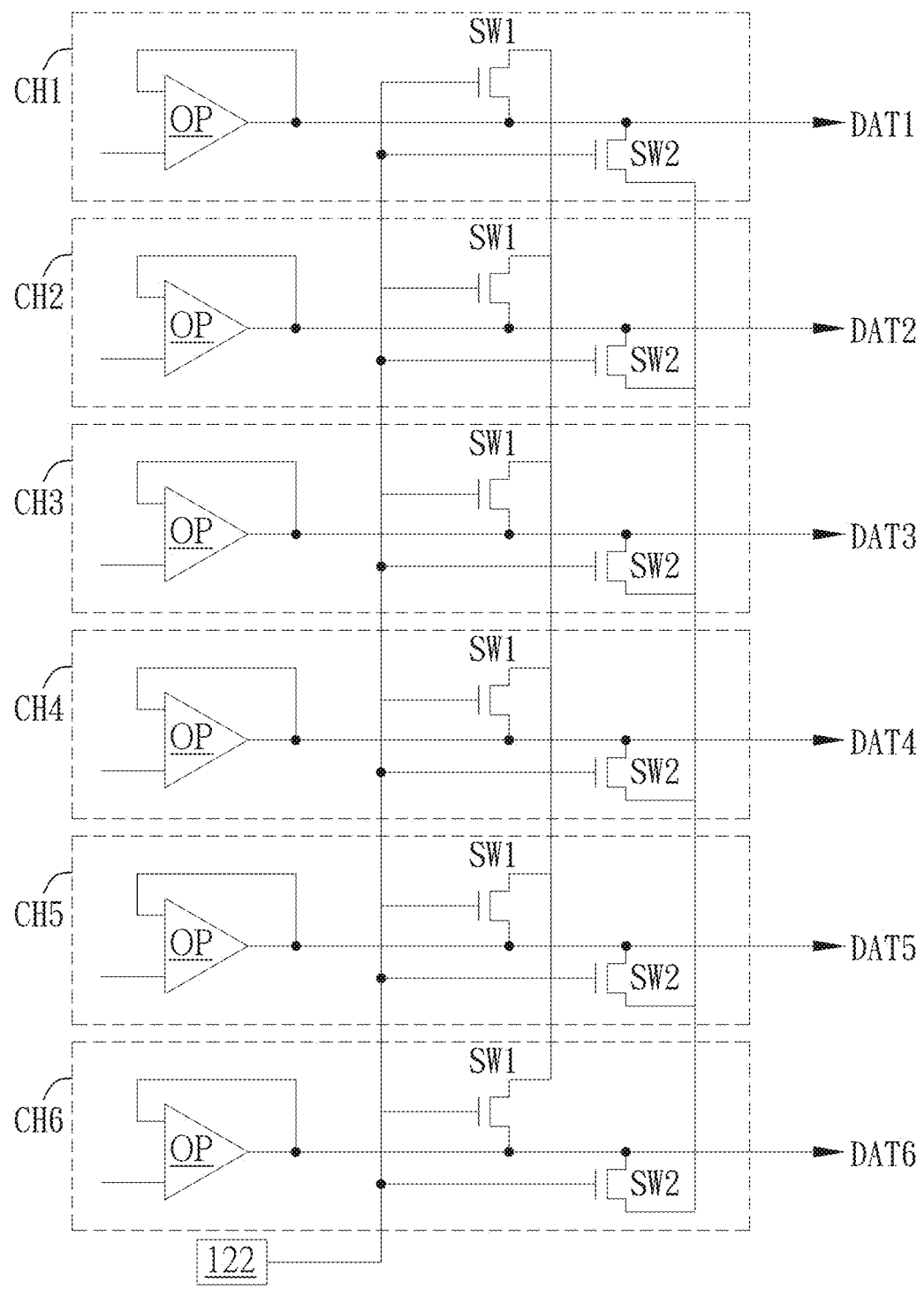
FIG. 3 illustrates a schematic diagram of each output channel CH1~CH6 includes an operational amplifier OP, a first switch SW1 and a second switch SW2.

Then, please refer to FIG. 3. In an embodiment, the first output channel CH1~the sixth output channel CH6 of the source driver are used to output a first data signal DAT1~a sixth data signal DAT6 to a panel respectively. Each of the first output channel CH1~the sixth output channel CH6 can include an operational amplifier OP, a first switch SW1 and a second switch SW2. One input terminal and an output terminal of the operational amplifier OP are coupled. The first switch SW1 and the second switch SW2 are coupled to the output terminal of the operational amplifier OP respectively. The operation of the first switch SW1 and the second switch SW2 are controlled by the switching unit 122. The switching unit 122 correspondingly controls whether the first switch SW1 and the second switch SW2 are conducted or not according to the lowest power consumption charge sharing method. It should be noticed that the first switch SW1 and the second switch SW2 are conducted at the same time only when the charge-sharing is performed in all output channels. In other conditions, the first switch SW1 and the second switch SW2 are not conducted at the same time.

It should be noticed that each output channel CH1~CH6 includes two charge-sharing paths (namely the first switch SW1 and the second switch SW2); therefore, it will totally have [C(6,6)*C(0,0)]+[C(6,5)*C(1,1)]+[C(6,5)*C(1,0)]+[C(6,4)*C(2,2)]+[C(6,4)*C(2,1)]+[C(6,4)*C(2,0)]+[C(6,3)*C(3,3)/2!)]+[C(6,3)*C(3,2)]+[C(6,3)*C(3,1)]+[C(6,3)*C(3,0)]=223 charge-sharing methods, that is to say, the step S12 should set 223 registers to store the averages after charge-sharing is performed by the above-mentioned 223 charge-sharing methods. The rest can be deduced by analogy and will not be described here.

In practical applications, the charge-sharing average registers can include:

(1) Any one output channel of each set of output channels CH1~CH6 performs charge-sharing through the conducted first switch SW1 or the conducted second switch SW2. For example, if the first output channel CH1 of each set of output channels CH1~CH6 performs charge-sharing through the conducted first switch SW1, then the charge-sharing average register can be represented by SW1_1, but not limited to this; if the sixth output channel CH6 of each set of output channels CH1~CH6 performs charge-sharing through the conducted second switch S2, then the charge-sharing average register can be represented by SW2_6, but not limited to this. The rest can be deduced by analogy and will not be described here.

(2) Any two output channels of the output channels CH1~CH6 performs charge-sharing through the conducted first switch SW1 or the conducted second switch SW2. For example, if the first output channel CH1 and the fourth output channel CH4 of the output channels CH1~CH6 perform charge-sharing through the conducted first switch SW1, then the charge-sharing average register can be represented by SW1_14, but not limited to this; if the second output channel CH2 and the fifth output channel CH5 of the output channels CH1~CH6 perform charge-sharing through the conducted second switch S2, then the charge-sharing average register can be represented by SW2_25, but not limited to this. The rest can be deduced by analogy and will not be described here.

(3) Any three output channels of the output channels CH1~CH6 performs charge-sharing through the conducted first switch SW1 or the conducted second switch SW2. For example, if the first output channel CH1~the third output channel CH3 of the output channels CH1~CH6 perform charge-sharing through the conducted first switch SW1, then the charge-sharing average register can be represented by SW1_123, but not limited to this; if the fourth output channel CH4~the sixth output channel CH6 of the output channels CH1~CH6 perform charge-sharing through the conducted second switch S2, then the charge-sharing average register can be represented by SW2_456, but not limited to this. The rest can be deduced by analogy and will not be described here.

(4) all output channels of the output channels CH1~CH6 performs charge-sharing through the conducted first switch SW1 and the conducted second switch SW2, then the charge-sharing average register can be represented by SW12_all, but not limited to this.

TABLE 1

|  | CH1(+) | CH2(−) | CH3(+) | CH4(−) | CH5(+) | CH6(−) |
| --- | --- | --- | --- | --- | --- | --- |
| L(N − 1) | 0 | 255 | 255 | 0 | 0 | 255 |
| L(N) | 255 | 0 | 0 | 255 | 0 | 255 |

Please refer to Table 1. If the first output channel CH1~the sixth output channel CH6 use the output polarity inversion method of 1V inversion, namely the output polarities of the first output channel CH1, the second output channel CH2, the third output channel CH3, the fourth output channel CH4, the fifth output channel CH5 and the sixth output channel CH6 are positive (+), negative (−), positive (+), negative (−), positive (+), negative (−) in order. If the step S14 selects the normally black mode, then when the step S16 calculates the average of the (N−1)-th display line of the panel after charge-sharing, the positive (+) output channels maintain their original data signals unchanged and the negative (−) output channels convert their original data signals to negative values.

For example, as to the charge-sharing average register SW1_125, since the first output channel CH1, the second output channel CH2 and the fifth output channel CH5 of the output channels CH1~CH6 perform charge-sharing through the conducted first switch SW1, the average of the (N−1)-th display line of the panel after charge-sharing stored in the charge-sharing average register SW1_125 will be [0+(−255)+0]/3=−85.

Similarly, as to the charge-sharing average register SW2_346, since the third output channel CH3, the fourth output channel CH4 and the sixth output channel CH6 of the output channels CH1~CH6 perform charge-sharing through the conducted second switch SW2, the average of the (N−1)-th display line of the panel after charge-sharing stored in the charge-sharing average register SW2_346 will be [255+0+(−255)]/3=0. The rest can be deduced by analogy and will not be described here.

It should be noticed that the average of the (N−1)-th display line of the panel after charge-sharing stored in the charge-sharing average register ranges from −255 to 255.

Since the averages after charge-sharing stored in all charge-sharing average registers can be obtained according to the foregoing method, then the step S20 can further calculate the total power consumption when the data signals are transmitted from the (N−1)-th display line L(N−1) to the N-th display line L(N) through the 223 possible charge-sharing methods among the first output channel CH1~the sixth output channel CH6.

According to the above example, if the first output channel CH1, the second output channel CH2 and the fifth output channel CH5 perform charge-sharing through the conducted first switch SW1, and the third output channel CH3, the fourth output channel CH4 and the sixth output channel CH6 perform charge-sharing through the conducted second switch SW2, and the average of the (N−1)-th display line L(N−1) after charge-sharing stored in the average register SW1_125 is −85 and the average of the (N−1)-th display line L(N−1) after charge-sharing stored in the average register SW2_346 is 0, then the power consumption of the output channels CH1~CH6 when the output channels CH1~CH6 transmit the data signals from the (N−1)-th display line L(N−1) to the N-th display line L(N) can be calculated by the step S20 respectively.

As to the first output channel CH1, the average of the (N−1)-th display line L(N−1) after charge-sharing is −85 stored in the average register SW1_125 and the value of the data signal outputted by the first output channel CH1 at the N-th display line L(N) is 255 according to Table 1, that is to say, the value is increased from the average −85 of the (N−1)-th display line L(N−1) to the value 255 of the N-th display line L(N); therefore, the power consumption is 255−(−85)=340.

As to the second output channel CH2, the average of the (N−1)-th display line L(N−1) after charge-sharing is −85 stored in the average register SW1_125 and the value of the data signal outputted by the second output channel CH2 at the N-th display line L(N) is 0 according to Table 1, that is to say, the value is increased from the average −85 of the (N−1)-th display line L(N−1) to the value 0 of the N-th display line L(N); therefore, the power consumption is 0−(−85)=85.

As to the third output channel CH3, the average of the (N−1)-th display line L(N−1) after charge-sharing is 0 stored in the average register SW2_346 and the value of the data signal outputted by the third output channel CH3 at the N-th display line L(N) is 0 according to Table 1, that is to say, the value is maintained 0 from the (N−1)-th display line L(N−1) to the N-th display line L(N); therefore, the power consumption is 0−(0)=0. That is to say, there is no power consumption.

As to the fourth output channel CH4, the average of the (N−1)-th display line L(N−1) after charge-sharing is 0 stored in the average register SW2_346 and the value of the data signal outputted by the fourth output channel CH4 at the N-th display line L(N) is 255 according to Table 1, and since the output polarity of the fourth output channel CH4 is negative (−), the value 255 is converted into negative value −255, that is to say, the value is decreased from the average 0 of the (N−1)-th display line L(N−1) to the value −255 of the N-th display line L(N); therefore, the power consumption is (−255)−0=−255. Since the calculated power consumption is a negative value, it is regarded as 0, namely it does not consume power.

As to the fifth output channel CH5, the average of the (N−1)-th display line L(N−1) after charge-sharing is −85 stored in the average register SW1_125 and the value of the data signal outputted by the fifth output channel CH5 at the N-th display line L(N) is 0 according to Table 1, that is to say, the value is increased from the average −85 of the (N−1)-th display line L(N−1) to the value 0 of the N-th display line L(N); therefore, the power consumption is 0−(−85)=85.

As to the sixth output channel CH6, the average of the (N−1)-th display line L(N−1) after charge-sharing is 0 stored in the average register SW2_346 and the value of the data signal outputted by the sixth output channel CH6 at the N-th display line L(N) is 255 according to Table 1, and since the output polarity of the sixth output channel CH6 is negative (−), the value 255 is converted into negative value −255, that is to say, the value is decreased from the average 0 of the (N−1)-th display line L(N−1) to the value −255 of the N-th display line L(N); therefore, the power consumption is (−255)−0=−255. Since the calculated power consumption is a negative value, it is regarded as 0, namely it does not consume power.

According to the above, the total power consumption when the data signals outputted by the first output channel CH1~the sixth output channel CH6 are transmitted from the (N−1)-th display line L(N−1) to the N-th display line L(N) equals to 340+85+0+0+85+0=510. The rest can be deduced by analogy, and will not be described here.

Figure 4:
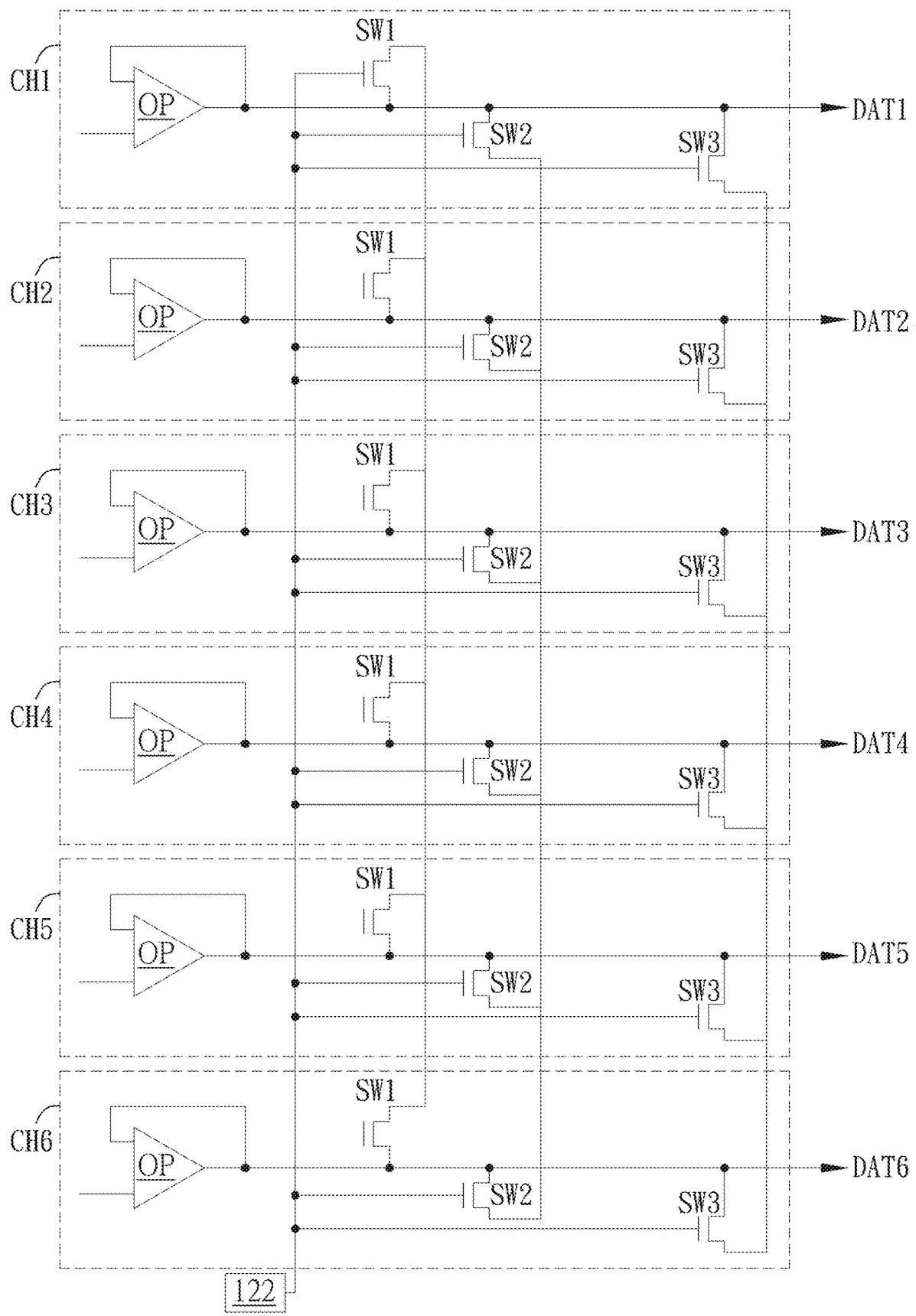
FIG. 4 illustrates a schematic diagram of each output channel CH1~CH6 includes an operational amplifier OP, a first switch SW1, a second switch SW2 and a third switch SW3.

Please refer to FIG. 4. In another embodiment, the first output channel CH1~the sixth output channel CH6 of the source driver are used to output a first data signal DAT1-a sixth data signal DAT6 to a panel respectively. Each output channel CH1~CH6 includes an operational amplifier OP, a first switch SW1, a second switch SW2 and a third switch SW3. One input terminal and an output terminal of the operational amplifier OP are coupled. The first switch SW1, the second switch SW2 and the third switch SW3 are coupled to the output terminal of the operational amplifier OP respectively. The operation of the first switch SW1, the second switch SW2 and the third switch SW3 are controlled by the switching unit 122. The switching unit 122 correspondingly controls whether the first switch SW1, the second switch SW2 and the third switch SW3 are conducted or not according to the lowest power consumption charge sharing method, but not limited to this.

Figure 5:
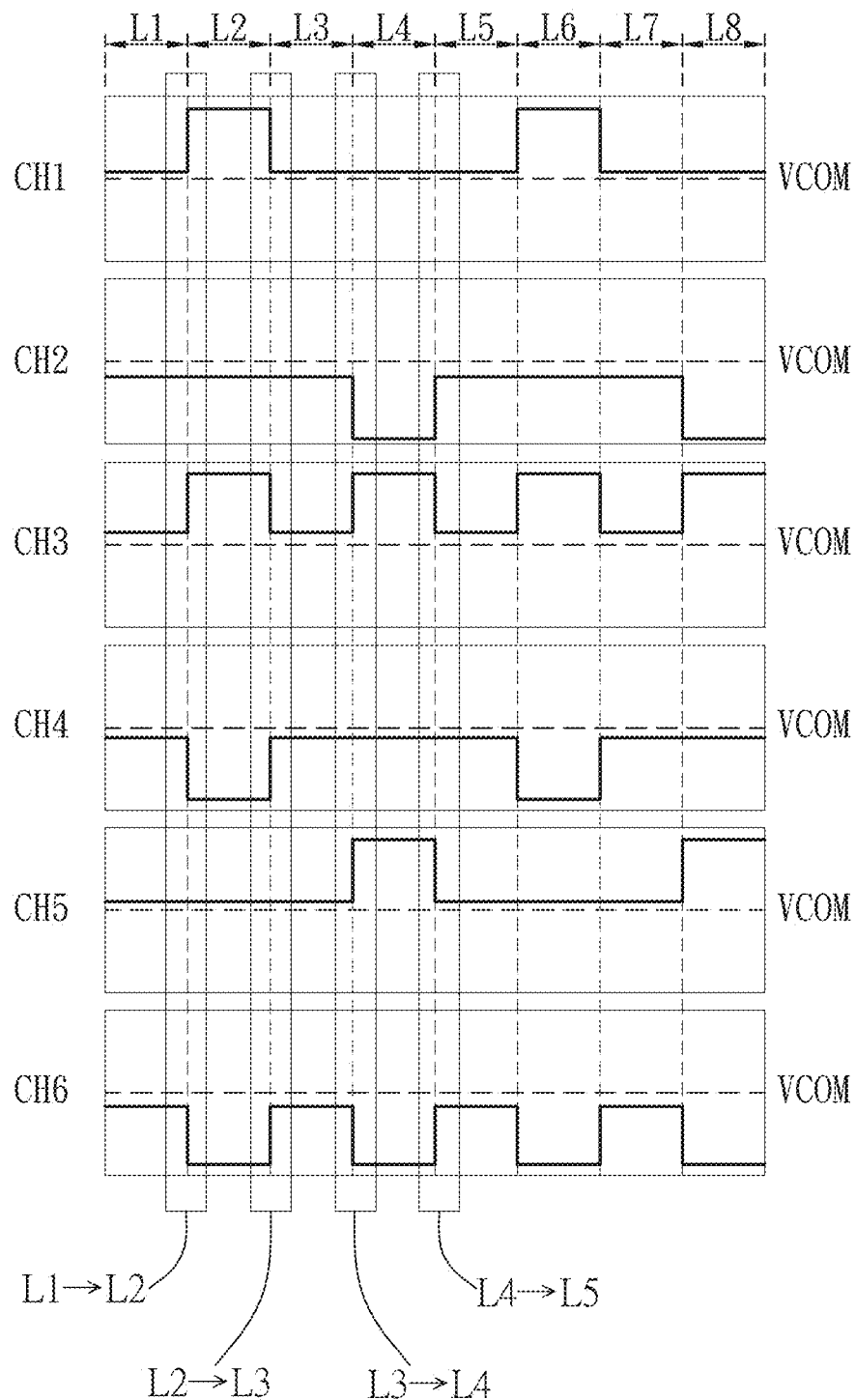
FIG. 5 illustrates a schematic diagram of the voltage levels of the data signals outputted by the output channels CH1~CH6 using the output polarity inversion method of 1V inversion when the panel displays a single color.

Then, please refer to FIG. 5. FIG. 5 illustrates a schematic diagram of the voltage levels of the data signals outputted by the output channels CH1~CH6 using the output polarity inversion method of 1V inversion when the panel displays a single color.

As shown in FIG. 5, since the first output channel CH1~the sixth output channel CH6 use the output polarity inversion method of 1V inversion, the output polarities of the first output channel CH1, the second output channel CH2, the third output channel CH3, the fourth output channel CH4, the fifth output channel CH5 and the sixth output channel CH6 are positive (+), negative (−), positive (+), negative (−), positive (+) and negative (−) in order.

It can be found from FIG. 5 that when the output polarity of the output channels is positive (+), the voltage levels of the data signals outputted by the output channels are all higher than the common voltage VCOM; on the contrary, when the output polarity of the output channels is negative (−), the voltage levels of the data signals outputted by the output channels are all lower than the common voltage VCOM.

It should be noticed that L1→L2 in FIG. 5 represents that the data signal is transmitted from the first data line L1 to the second data line L2, L2→L3 in FIG. 5 represents that the data signal is transmitted from the second data line L2 to the third data line L3, L3→L4 in FIG. 5 represents that the data signal is transmitted from the third data line L3 to the fourth data line L4, and L4→L5 in FIG. 5 represents that the data signal is transmitted from the fourth data line L4 to the fifth data line L5, wherein examples of L2→L3 and L4→L5 will be introduced as follows and so on.

Please refer to FIG. 5 and the first output channel CH1~the sixth output channel CH6 without charge sharing shown in the left-side of FIG. 6.

As to the first output channel CH1, when the positive (+) data signal outputted by the first output channel CH1 is transmitted from the second data line L2 of the panel to the third data line L3, the positive (+) data signal is changed from high-level to low-level.

As to the second output channel CH2, when the negative (−) data signal outputted by the second output channel CH2 is transmitted from the second data line L2 of the panel to the third data line L3, the negative (−) data signal is maintained at high-level.

As to the third output channel CH3, when the positive (+) data signal outputted by the third output channel CH3 is transmitted from the second data line L2 of the panel to the third data line L3, the positive (+) data signal is changed from high-level to low-level.

As to the fourth output channel CH4, when the negative (−) data signal outputted by the fourth output channel CH4 is transmitted from the second data line L2 of the panel to the third data line L3, the negative (−) data signal is changed from low-level to high-level. It should be noticed that the fourth output channel CH4 needs to consume energy (power consumption) Q at this time.

As to the fifth output channel CH5, when the positive (+) data signal outputted by the fifth output channel CH5 is transmitted from the second data line L2 of the panel to the third data line L3, the positive (+) data signal is maintained at low-level.

As to the sixth output channel CH6, when the negative (−) data signal outputted by the sixth output channel CH6 is transmitted from the second data line L2 of the panel to the third data line L3, the negative (−) data signal is changed from low-level to high-level. It should be noticed that the sixth output channel CH6 needs to consume energy (power consumption) Q at this time.

Above all, if no charge sharing is performed in the first output channel CH1~the sixth output channel CH6, total energy consumed (power consumption) is 2Q when the data signals outputted by the first output channel CH1~the sixth output channel CH6 are transmitted from the second data line L2 of the panel to the third data line L3.

When the data signals are transmitted from the second data line L2 of the panel to the third data line L3, as shown in the right-side of the FIG. 6, the lowest power consumption charge-sharing method selected by the liquid crystal display power saving method of the invention from all charge-sharing methods can be: performing charge sharing on the first output channel CH1 of positive (+) output and the fourth output channel CH4 of negative output (−) and performing charge sharing on the third output channel CH3 of positive (+) output and the sixth output channel CH6 of negative output (−). Therefore, the switching unit 122 will correspondingly switch the first output channel CH1 and the fourth output channel CH4 to be coupled and switch the third output channel CH3 and the sixth output channel CH6 to be coupled according to the lowest power consumption charge-sharing method.

Since the first output channel CH1 is changed from high-level to low-level and the fourth output channel CH4 is changed from low-level to high-level, when they are coupled to perform charge sharing, the voltage changes of the first output channel CH1 and the fourth output channel CH4 will be compensated without power consumption. Similarly, since the third output channel CH3 is changed from high-level to low-level and the sixth output channel CH6 is changed from low-level to high-level, when they are coupled to perform charge sharing, the voltage changes of the third output channel CH3 and the sixth output channel CH6 will be compensated without power consumption. Therefore, the total energy consumed (power consumption) is zero when the data signals outputted by the first output channel CH1~the sixth output channel CH6 are transmitted from the second data line L2 of the panel to the third data line L3. That is to say, using the lowest power consumption charge-sharing method can effectively reduce power consumption.

Similarly, please refer to FIG. 5 and the first output channel CH1~the sixth output channel CH6 without charge sharing shown in the left-side of FIG. 7.

As to the first output channel CH1, when the positive (+) data signal outputted by the first output channel CH1 is transmitted from the fourth data line L4 of the panel to the fifth data line L5, the positive (+) data signal is maintained at low-level.

As to the second output channel CH2, when the negative (−) data signal outputted by the second output channel CH2 is transmitted from the fourth data line L4 of the panel to the fifth data line L5, the negative (−) data signal is changed from low-level to high-level. It should be noticed that the second output channel CH2 needs to consume energy (power consumption) Q at this time.

As to the third output channel CH3, when the positive (+) data signal outputted by the third output channel CH3 is transmitted from the fourth data line L4 of the panel to the fifth data line L5, the positive (+) data signal is changed from high-level to low-level.

As to the fourth output channel CH4, when the negative (−) data signal outputted by the fourth output channel CH4 is transmitted from the fourth data line L4 of the panel to the fifth data line L5, the negative (−) data signal is maintained at high-level.

As to the fifth output channel CH5, when the positive (+) data signal outputted by the fifth output channel CH5 is transmitted from the fourth data line L4 of the panel to the fifth data line L5, the positive (+) data signal is changed from high-level to low-level.

As to the sixth output channel CH6, when the negative (−) data signal outputted by the sixth output channel CH6 is transmitted from the fourth data line L4 of the panel to the fifth data line L5, the negative (−) data signal is changed from low-level to high-level. It should be noticed that the sixth output channel CH6 needs to consume energy (power consumption) Q at this time.

Above all, if no charge sharing is performed in the first output channel CH1~the sixth output channel CH6, total energy consumed (power consumption) is 2Q when the data signals outputted by the first output channel CH1~the sixth output channel CH6 are transmitted from the fourth data line L4 of the panel to the fifth data line L5.

When the data signals are transmitted from the fourth data line L4 of the panel to the fifth data line L5, as shown in the right-side of the FIG. 6, the lowest power consumption charge-sharing way selected by the liquid crystal display power saving method of the invention from all charge-sharing ways can be: performing charge sharing on the third output channel CH3 of positive (+) output and the second output channel CH2 of negative output (−) and performing charge sharing on the fifth output channel CH5 of positive (+) output and the sixth output channel CH6 of negative output (−). Therefore, the switching unit 122 will correspondingly switch the third output channel CH3 and the second output channel CH2 to be coupled and switch the fifth output channel CH5 and the sixth output channel CH6 to be coupled according to the lowest power consumption charge-sharing way.

Since the third output channel CH3 is changed from high-level to low-level and the second output channel CH2 is changed from low-level to high-level, when they are coupled to perform charge sharing, the voltage changes of the third output channel CH3 and the second output channel CH2 will be compensated without power consumption. Similarly, since the fifth output channel CH5 is changed from high-level to low-level and the sixth output channel CH6 is changed from low-level to high-level, when they are coupled to perform charge sharing, the voltage changes of the fifth output channel CH5 and the sixth output channel CH6 will be compensated without power consumption. Therefore, the total energy consumed (power consumption) is zero when the data signals outputted by the first output channel CH1~the sixth output channel CH6 are transmitted from the fourth data line L4 of the panel to the fifth data line L5. That is to say, using the lowest power consumption charge-sharing way can effectively reduce power consumption.

Compared to the prior art, the liquid crystal display power saving method of the invention provides a charge-sharing algorism for any output channel of a source driver suitable for all pixel structures of the panel and it can select the lowest power consumption charge-sharing method between two adjacent data lines and then switch the coupling relationships among the output channels of the source driver accordingly to effectively reduce the power consumption of the liquid crystal display.

With the example and explanations above, the features and spirits of the invention will be hopefully well described. Those skilled in the art will readily observe that numerous modifications and alterations of the device may be made while retaining the teaching of the invention. Accordingly, the above disclosure should be construed as limited only by the metes and bounds of the appended claims.

What is claimed is:

1. A liquid crystal display power saving method, comprising steps of:
    (a) dividing output channels coupled to a panel into multiple sets of output channels and each set of output channels comprising M output channels, wherein M is a positive integer;
    (b) calculating an average of a (N−1)-th display line of the panel after charge-sharing, wherein N is a positive integer larger than 1;
    (c) determining whether each of the M output channels consumes power when it transmits a data signal from the (N−1)-th display line to a N-th display line;
    (d) calculating a total power consumption of transmitting the data signal from the (N−1)-th display line to the N-th display line under a plurality of possible charge-sharing methods among the M output channels;
    (e) selecting a lowest power consumption charge sharing method from the plurality of possible charge sharing methods; and
    (f) switching coupling relationships among the M output channels according to the lowest power consumption charge sharing method;
    wherein the step (c) determines whether each output channel consumes power according to a voltage level variation when the data signal outputted by the output channel is transmitted from the (N−1)-th display line to the N-th display line, and
    wherein if the voltage level variation of the data signal is away from a reference voltage level, then the step (c) determines that the output channel consumes power.

2. The liquid crystal display power saving method of claim 1, wherein the reference voltage level is a ground voltage.

3. The liquid crystal display power saving method of claim 1, wherein if the voltage level variation of the data signal is approaching a reference voltage level, then the step (c) determines that the output channel does not consume power.

4. The liquid crystal display power saving method of claim 3, wherein the reference voltage level is a ground voltage.

5. The liquid crystal display power saving method of claim 1, further comprising a step between the step (a) and the step (b):
    selecting a normally black mode or a normally white mode.

6. The liquid crystal display power saving method of claim 5, wherein in the normally black mode, the data signals outputted by the M output channels maintain their original phase.

7. The liquid crystal display power saving method of claim 5, wherein in the normally white mode, the data signals outputted by the M output channels change their original phase to a reversed phase.

8. The liquid crystal display power saving method of claim 1, further comprising a step between step (a) and step (b):
    setting a register to store the average after charge-sharing calculated by the step (b).

9. A liquid crystal display power saving method, comprising steps of:
    (a) dividing output channels coupled to a panel into multiple sets of output channels and each set of output channels comprising M output channels, wherein M is a positive integer;
    (b) calculating an average of a (N−1)-th display line of the panel after charge-sharing, wherein N is a positive integer larger than 1;
    (c) determining whether each of the M output channels consumes power when it transmits a data signal from the (N−1)-th display line to a N-th display line;
    (d) calculating a total power consumption of transmitting the data signal from the (N−1)-th display line to the N-th display line under a plurality of possible charge-sharing methods among the M output channels;
    (e) selecting a lowest power consumption charge sharing method from the plurality of possible charge sharing methods; and
    (f) switching coupling relationships among the M output channels according to the lowest power consumption charge sharing method;
wherein the step (c) determines whether each output channel consumes power according to a voltage level variation when the data signal outputted by the output channel is transmitted from the (N−1)-th display line to the N-th display line; if the voltage level variation of the data signal is approaching a reference voltage level, then the step (c) determines that the output channel does not consume power.

10. The liquid crystal display power saving method of claim 9, further comprising a step between step (a) and step (b):
    setting a register to store the average after charge-sharing calculated by the step (b).

* * * * *